United States Patent [19]
Zehavi et al.

[11] Patent Number: 5,633,881
[45] Date of Patent: May 27, 1997

[54] TRELLIS ENCODER AND DECODER BASED UPON PUNCTURED RATE ½ CONVOLUTIONAL CODES

[75] Inventors: Ephraim Zehavi, San Diego; Jack K. Wolf, Rancho Mirage, both of Calif.

[73] Assignee: Qualcomm Incorporated, San Diego, Calif.

[21] Appl. No.: 368,738

[22] Filed: Jan. 4, 1995

Related U.S. Application Data

[63] Continuation of Ser. No. 23,788, Feb. 22, 1993, abandoned.

[51] Int. Cl.⁶ .................................................. G06F 11/10
[52] U.S. Cl. .......................... 371/37.5; 371/43; 375/308
[58] Field of Search .................................. 371/2.1, 37.1, 371/37.8, 43, 45, 46, 37.4, 37.5, 44; 375/24, 39, 53, 242, 246, 262, 268, 269, 308, 329, 341, 271, 279

[56] References Cited

U.S. PATENT DOCUMENTS

| | | | |
|---|---|---|---|
| 3,789,360 | 1/1974 | Clark, Jr. et al. | 340/146.1 |
| 4,447,908 | 5/1984 | Chevillat et al. | 375/42 |
| 4,462,101 | 7/1984 | Yasuda et al. | 371/43 |
| 4,586,182 | 4/1986 | Gallagher | 371/30 |
| 4,777,636 | 10/1988 | Yamashita et al. | 371/43 |
| 4,807,253 | 2/1989 | Hagenauer et al. | 375/57 |
| 4,821,288 | 4/1989 | Peile | 375/11 |
| 4,823,346 | 4/1989 | Kobayashi et al. | 371/43 |
| 4,833,693 | 5/1989 | Eyuboglu | 375/34 |
| 4,980,897 | 12/1990 | Decker et al. | 375/38 |
| 4,993,046 | 2/1991 | Saito et al. | 375/39 |
| 5,029,185 | 7/1991 | Wei | 375/27 |
| 5,056,112 | 10/1991 | Wei | 375/53 |
| 5,113,400 | 5/1992 | Gould et al. | 371/43 |
| 5,115,453 | 5/1992 | Calderbank et al. | 375/39 |
| 5,233,629 | 8/1993 | Paik et al. | 375/39 |
| 5,243,627 | 9/1993 | Betto et al. | 375/39 |
| 5,305,352 | 4/1994 | Calderbank et al. | 375/39 |
| 5,321,727 | 6/1994 | Paik et al. | 375/39 |
| 5,363,408 | 11/1994 | Paik et al. | 375/39 |
| 5,396,518 | 3/1995 | How | 375/265 |
| 5,408,502 | 4/1995 | How | 375/340 |

OTHER PUBLICATIONS

"Trellis—Coded MPSK Modulation for Highly Efficient Military Satellite Applications", Viterbi et al, *IEEE*, 1988, pp. 647–651.

"Practical Applications of TCM", Dehesh et al, *IEEE*, 1990, pp. 15.3.1–15.3.4.

"A 25 MHz Viterbi FEC Codec", Kerr et al, *1990 IEEE Custom Integrated Circuit Conference Proceedings*, May 13–16, 1990, pp. 13.6.1–13.6.5.

"A Pragmatic Approach to Trellis–Coded Modulation", Viterbi et al, *IEEE Communications Magazine*, Jul. 1989, pp. 11–19.

*Primary Examiner*—Robert W. Beausoliel, Jr.
*Assistant Examiner*—Albert Décady
*Attorney, Agent, or Firm*—Russell B. Miller; Sean English

[57] ABSTRACT

An encoder for encoding data as trellis coded data and a decoder for decoding the trellis coded data. The encoder uses a rate ½ convolutional encoder punctured to a rate k/n to produce n symbols from k input bits. The symbols are converted by a converter to sets of p symbols and provided to an interleaver. In the interleaver certain ones of the symbols are delayed. Symbol sets are output from the interleaver to a $2^P$-ary modem for modulation and transmission. The decoder uses a modem for providing from the modulated data sets of p symbols. A deinterleaver delays certain ones of the symbols to achieve time alignment of the originally interleaved symbols. The sets of time aligned symbols are provided to metric calculators for computing signal metrics which are provided to a converter for providing n sets of metrics to a metric decoder. The metric decoder computes from the n sets of metrics an estimate of the encoded k data bits.

36 Claims, 1 Drawing Sheet

TRELLIS ENCODER AND DECODER BASED UPON PUNCTURED RATE ½ CONVOLUTIONAL CODES

This application is a continuation of application Ser. No. 08/023,788, filed on Feb. 22, 1993 now abandoned.

BACKGROUND OF THE INVENTION

I. Field of the Invention

The present invention relates to data communications. More particularly, the present invention relates to a novel and improved method and apparatus for encoding and decoding trellis modulated data based upon punctured convolutional codes.

II. Description of the Related Art

The field of data communications is concerned with raising the data throughput of a transmission system with a limited signal to noise ratio (SNR). The use of error correcting circuitry such as the Viterbi decoder allows system tradeoffs to be made with smaller SNRs or higher data rates to be used with the same bit error rate (BER). The decrease in the SNR needed is generally referred to as coding gain. Coding gain may be determined from bit error performance curves. In a graph of bit error performance curves, the BER of uncoded and various coded data is charted against $E_b/N_o$, where $E_b$ is the energy per bit and $N_o$ is the one sided Gaussian White Noise power spectral density. The coding gain at any point along a bit error performance curve for a particular BER level is determined by subtracting the coded $E_b/N_o$ from the uncoded $E_b/N_o$. In the paper "Viterbi Decoding for Satellite and Space Communication", by J. A. Heller and I. M. Jacobs, IEEE Transactions on Communication Technology, Vol. COM-19, pgs. 835-848, October 1971, extensive results of simulations on various decoder apparatus were reported.

The coding rate and constraint length are used to define the Viterbi decoder. The coding rate (m/n) corresponds to the number of coding symbols produced (n) for a given number of input bits (m). The coding rate of ½ has become one of the most popular rates, although other code rates are also generally used. One class of codes with m≠1 are called punctured codes and are produced by discarding or erasing symbols from the rate 1/n code. The constraint length (K) is related to the length of the convolutional encoder used in the encoding of the data. A constraint length of K=7 is typical in convolutional coding schemes. The convolutional encoder can be thought of as a Finite Impulse Response (FIR) filter with binary coefficients and length K-1. This filter produces a symbol stream with $2^{K-1}$ possible states.

The basic principal of the Viterbi algorithm is to take a convolutionally encoded data stream that has been transmitted over a noisy channel and use the properties of the convolutional code to determine the transmitted bit stream. The Viterbi algorithm is a computationally efficient method of updating the conditional probabilities of all $2^{K-1}$ states and finding the most probable bit sequence transmitted. In order to compute this probability, all the conditional probabilities of $2^{K-1}$ states for each bit must be computed. For a rate ½ code, the resulting decision from each of these computations is stored as a single bit in a path memory.

A chainback operation, an inverse of the encoding operation, is performed in which the $p \cdot 2^{K-1}$ decision bits are used to select an output bit, where p is the path memory depth. After many states the most probable path will be selected with a high degree of certainty. The path memory depth must be sufficiently long to allow this probability to approach 1. For a rate ½ code, an exemplary path memory depth is about (5·K), or 35 states. For a rate ⅞ punctured code the optimal depth increases to 96 states.

Constraint lengths of K less than 5 are too small to provide any substantial coding gain, while systems with K greater than 7 are typically too complex to implement as a parallel architecture on a single VLSI device. As the constraint length increases, the number of interconnections in a fully parallel computation section increases as a function of $(2^{K-1} \cdot L)$, where L is the number of bits of precision in the state metric computations. Therefore, where K is greater than 7, serial computation devices are generally used which employ large external random access memories (RAMs).

In the paper "Channel Coding with Multilevel/Phase Signal" by G. Ungerboeck, IEEE Transactions on Information Theory, Vol. IT-28, pgs. 55-67, January 1982, a trellis coded modulation (TCM) was described. In Ungerboeck it was shown that within a given spectral bandwidth, it is possible to achieve an Asymptotic Coding Gain of up to 6 dB by employing a rate (n-1)/n convolutional code and doubling the signal set. Unfortunately, for each modulation technique and for each bit rate, the maximal coding again is achieved by a different convolutional code. Further disclosed were the results of a search for all convolutional codes for several rates and modulation techniques, and the best codes presented.

In the paper "A Pragmatic Approach to Trellis-Coded Modulation" by A. J. Viterbi, J. K. Wolf, E. Zehavi and R. Padovani, IEEE Communications Magazine, pgs. 11-19, July 1989, a pragmatic approach to trellis coded modulation (PTCM) was disclosed. The underlying concept therein is that a somewhat lower coding gain is achievable by a PTCM based on the "industry standard" rate ½, K=7 convolutional code. Although a lower coding gain is realized, it is very close to the coding gain of Ungerboeck at BERs of interest.

Trellis coding is an attractive coding technique since it possesses an aspect which other coding techniques lack. The power of trellis coding lies in the fact that even though no apparent coding operation is performed on some of the bit(s) of the input data, the decoder is able to provide error correction on all bits. Generally the use of TCM techniques to achieve efficient use of power-bandwidth resources has been limited to low speed applications in digital signal processor implementations. The use of PTCM techniques enable VLSI implementations of an encoder/decoder capable of operating at high rates. A decoder using PTCM techniques is capable of handling different modulation techniques, such as M-ary phase-shift keying (M-ary PSK) including Binary PSK (BPSK), Quadrature PSK (QPSK), 8-PSK, and 16-PSK.

In the paper, "Development of Variable-Rate Viterbi Decoder and Its Performance Characteristics," *Sixth International Conference on Digital Satellite Communications*, Phoenix Ariz., September 1983, Y. Yasuda, Y. Hirata, K. Nakamura and S. Otani discuss a method whereby a class of high rate binary convolutional codes can be constructed from a single lower rate binary convolutional code. The advantage of punctured codes for binary transmission is that the encoders and decoders for the entire class of codes can be constructed easily by modifying the single encoder and decoder for the rate ½ binary convolutional code from which the high rate punctured code was derived. The current invention will be concerned primarily with rate (m−1)/m binary convolutional codes (m a positive integer greater than or equal to 3) formed from puncturing a particular rate ½ convolutional code which has become a de-facto standard of the communications industry. This code has constraint length 7 and generator polynomials $G_1(D)=1+D^2+D^3+D^5+D^6$ and $G_2(D)=1+D+D^2+D^3+D^6$. Indeed, many commercial VLSI convolutional encoder and decoder chips (including a device marketed under Part No. Q1875 by QUALCOMM Incorporated of San Diego, Calif.) contain encoders and decoders for punctured binary codes using this de-facto standard rate ½ code.

It is therefore an object of the present invention to provide a novel method and circuitry for encoding and decoding trellis data using punctured rate ½ convolutional encoders.

SUMMARY OF THE INVENTION

The present invention is a novel and improved method and apparatus for encoding and decoding trellis modulated data based upon punctured rate ½ convolutional codes. In accordance with the present invention, a trellis encoder and decoder are disclosed in which a circuit is provided that encodes and decodes based upon punctured rate ½ convolutional encoding.

In the present invention, a transmitter encodes a bit stream, parallel or serial, according to a k/n encoding format provided by a punctured rate ½ encoder. For each set of k input bits n output symbols are provided by the first encoder. The n output symbols are then provided to a parallel n to parallel p converter that in effect gates the data symbols to provide sets of data of p symbols each. If n is divisible by p, the converter acts as a buffer to provide p symbols in each set. Otherwise the converter will wait for the next group of n symbols before providing the last group of p symbols from the current n symbols.

Each set of symbols is provided to an interleaver comprised of p-1 parallel delay elements that can be implemented as digital delays or delay lines having delays of predetermined duration. The purpose of the interleaving process is to increase the diversity in the data in such a way that if a modulated symbol is lost in transmission the error may be recoverable with the use of error correcting algorithms in the decoder. The output of the delays and the one undelayed symbol are then provided to an m-ary modulator that provides a modulation in accordance to the received bits.

In the receiver, a decoder presents the received signal to a demodulator that converts the modulation values to sets of p symbols. These sets of symbols are then provided to a deinterleaver that has p-1 delay elements that can be implemented as digital delays or delay lines. The three deinterleaved symbols are provided to three separate metric calculators that calculate from the received symbols metrics that define quantities proportional to the likelihood of alternative received hypotheses. The metrics are provided to a parallel p to parallel n converter that provides the metric values of data as n metrics to a rate ½ punctured decoder that operates with the aid of the Viterbi algorithm to provide a corrected estimate of the transmitted bit sequence.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
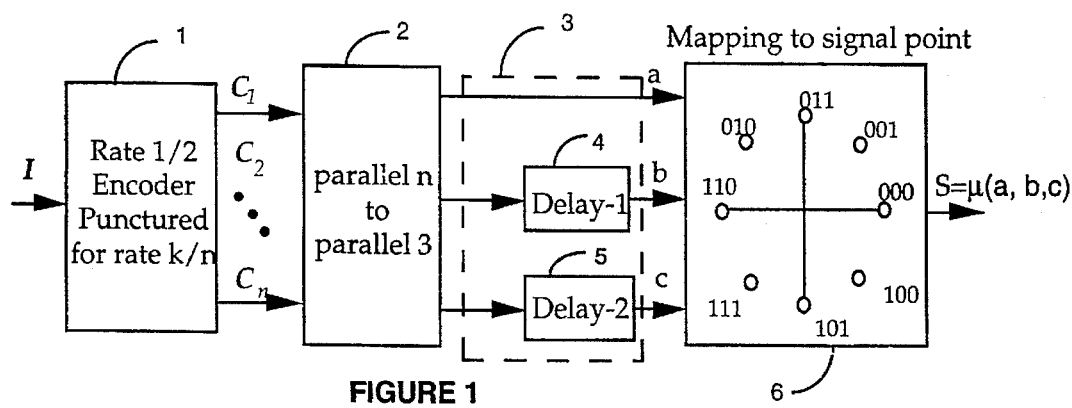
FIG. 1 is a block diagram of a trellis encoder for a rate ½ encoder punctured for a rate k/n.

Referring to FIG. 1, an encoding circuit is disclosed for encoding digital data preferably for m-ary PSK modulation and transmission. Although the example illustrated in FIG. 1 is configured for 8 PSK modulation, other m-ary modulation schemes are readily derived therefrom.

In FIG. 1 a bit stream is provided to encoder 1 which is configured as a rate ½ convolutional encoder punctured to a rate k/n. For each k bits 2k symbols (k symbol pairs) are generated. For only n-k of the generated symbol pairs are both outputs provided from encoder 1. For the remaining 2k-n pairs of generated symbols only one member of each pair is output from encoder 1.

The n output symbols ($C_1-C_n$) are provided to a parallel n to parallel p converter 2, where as illustrated in FIG. 1, p=3. Converter 2 gates the data symbols ($C_1-C_n$) to provide sets of data with p symbols in each set. For 8 PSK modulation ($2^P$-ary modulation where p=3), if n is divisible by p the converter acts as a buffer to provide three-tuples, i.e. sets of three symbols, for all of the current n symbols. Otherwise the converter will wait for the next group of n symbols before providing the last three-tuple from the current n symbols. Similarly for 16 PSK modulation ($2^P$-ary modulation where p=4) if n is divisible by p the converter acts as a buffer to provide quadruples, i.e. sets of four symbols, for all of the current n symbols. Otherwise the converter will wait for the next group of n symbols before providing the last quadruple from the current n symbols.

Each set of symbol data is provided to interleaver 3 comprised of p-1 delay elements. For the case of 8 PSK modulation, two delay elements are provided so as to delay two symbols of each three-tuple. As illustrated in FIG. 1 the symbol a provided on line a is provided undelayed to modulator or modem 6 and as such may be provided directly from converter 2 to modem 6. Delay elements 4 and 5 respectively delays to the symbols b and c respectively provided on lines b and c. The duration of the delay induced by delay element 5 is twice that of delay element 4. For higher orders of PSK modulation the delays may also be on the same incremental order with the longest delay being p-1 times the shortest delay. The duration of the delay of delay element 4 depends on the code in use, and in general is longer than the length of any codeword that has Hamming distance $d_{free}+1$ or less.

The purpose of the interleaving process is to increase the diversity of the transmitted signal. For example if a symbol is received weak or corrupted the interleaving process will disperse the effects of the lost signal among p nonconsecutive symbols. This will allow the Viterbi decoder to recover the correct data. A group of 3 bits (a,b,c) at the output of the interleaver is mapped by modem 6 into the 8-PSK signal set preferably, although not necessarily, according to a to modified Gray code mapping scheme. The mapped signal points are digitally pulse shaped by modem 6 for transmission over the channel.

Figure 2:
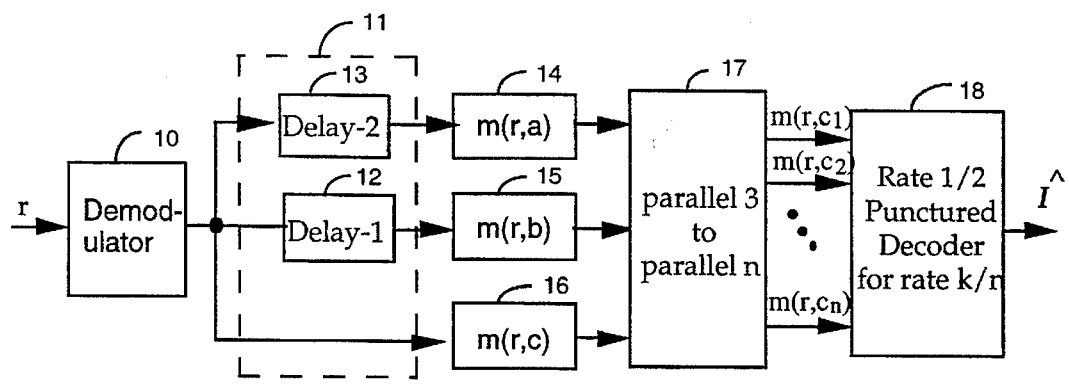
FIG. 2 is a block diagram of a trellis decoder for decoding data encoded by a rate ½ encoder punctured for a rate k/n.

Referring to FIG. 2, the received modulated data r is received by demodulator or modem 10 and converted to sets of p symbols. The sets of p symbols are provided to deinterleaver 11 comprised of p-1 delay elements. For the 8 PSK example modem 10 converts the received signal into three-tuples of symbols and provides each three-tuple to deinterleaver 11 which in this example is comprised of the two delay elements 12 and 13. In this case the symbol a is provided to delay element 13, with the symbol b provided to delay element 12. Delay element 13 provides a delay in the symbol a corresponding on the order of the delay provided to symbol c (delay element 5) in transmission encoding. Similarly delay element 12 provides a delay in the symbol b corresponding on the order of the delay provided to symbol b (delay element 4) in transmission encoding. Thus interleaver 11 realigns the symbol set as provided to interleaver 3 for transmission. The output of deinterleaver 11 is provided to p metric calculators. It is again noted that since the symbol c is undelayed it may be provided directly from modem 10 to a metric calculator. For the 8 PSK example the three-tuples are provided to three metric calculators 14, 15 and 16. For this 8 PSK system the receiver uses the following metrics.

$$m(r,a) = -min\{\|r-\mu(a,0,0)\|^2, \|r-\mu(a,0,1)\|^2, \|r-\mu(a,1,0)\|^2, \|r-\mu(a,1,1)\|^2\}$$

$$m(r,b) = -min\{\|r-\mu(0,b,0)\|^2, \|r-\mu(0,b,1)\|^2, \|r-\mu(1,b,0)\|^2, \|r-\mu(1,b,1)\|^2\}$$

$$m(r,c) = -min\{\|r-\mu(0,0,c)\|^2, \|r-\mu(0,1,c)\|^2, \|r-\mu(1,0,c)\|^2, \|r-\mu(1,1,c)\|^2\},$$

where $\|r-\mu(x,y,z)\|^2$ is the Euclidean distance between the received signal r and the signal point $\mu(x,y,z)$. Similar metrics may be computed for systems using other m-ary modulation.

Figure 3:
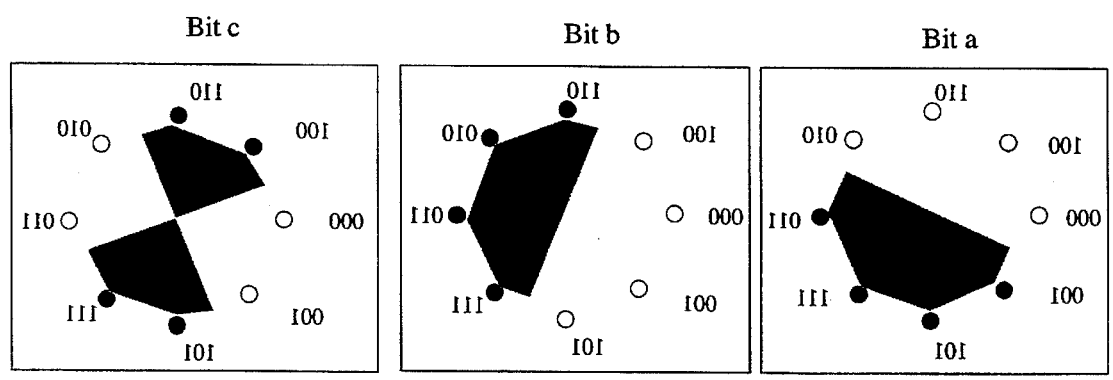
FIG. 3 is a diagram illustrating the spatial relationships in octal modulated signal space.

Each of metric calculators 14 (metrics m(r,a)), 15 (metrics (m(r,b)) and 16 (metrics m(r,c)) generates two metrics associated with the hypotheses that a=0 or a=1. Note that all the signal points with a value a=0 are in one subset and all the signal points with a value a=1 are in another subset as shown in FIG. 3.

The metrics are provided to a parallel p to parallel n buffer 17 that stores the metrics that arrive in p sets and provides n sets of metrics to Viterbi decoder 18. Decoder 18 is configured as a rate ½ punctured decoder for rate k/n decoding. The rate ½ punctured decoder for rate k/n provides from the received metrics in accordance with the history of received data a corrected estimate of the input bits.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A method for encoding digital data for trellis modulation comprising the steps of:

receiving k input data bits;

encoding said k input data bits according to a first encoding format to provide n symbols;

converting said n symbols to provide said n symbols as a sequence of sets of at least three symbols;

delaying for a predetermined first duration a second symbol of each set of three symbols;

delaying for a predetermined second duration a third symbol of each set of three symbols; and providing for modulation an interleaved symbol set including a first symbol of one of said sets of symbols with corresponding delayed second and third symbols of previous symbol sets.

2. The method of claim 1 wherein said step of providing for modulation an interleaved symbol set includes the step of mapping said interleaved symbol set to a modulation value according to a second encoding format.

3. A method for decoding interleaved trellis modulated data comprising the steps of:

receiving and decoding, in accordance with a first decoding format, said interleaved trellis modulated data to provide sets of three symbols;

delaying for a predetermined first duration a first symbol of each set of three symbols;

delaying for a predetermined second duration a second symbol of each set of three symbols;

combining delayed first and second symbols with third symbols of said sets of three symbols to provide a set of n symbols; and decoding according to a decoding format said set of n symbols.

4. The method of claim 3 wherein said step of decoding is performed with a second decoding format.

5. An apparatus for encoding data, comprising:

encoding means for receiving user data and encoding said user data into a first number of encoded symbol streams;

symbol grouping means for converting said first number of encoded symbol streams into a different second number of reordered encoded symbol streams, said symbol grouping means comprising a plurality of delay means wherein each of said plurality of delay means delays ones of said second number of reordered encoded symbol streams by different delays; and transmitter means for receiving successive sets of encoded symbols provided by said second number of reordered encoded symbol streams, and for modulating and transmitting said successive sets of encoded symbols in accordance with a predetermined encoding format.

6. The apparatus of claim 5 wherein said encoding means is a convolutional encoder.

7. The apparatus of claim 5 wherein said encoding means is a rate ½ encoder punctured for rate k/n where k and n are integers and k/n is a fraction greater than ½.

8. The apparatus of claim 5 wherein said symbol grouping means further includes parallel conversion means for generating each of said second number of reordered encoded symbol streams by grouping symbols from selected ones of said first number of encoded symbol streams.

9. The apparatus of claim 5 wherein said predetermined encoding format is a modified Gray code.

10. The apparatus of claim 5 wherein said predetermined encoding format is an 8-ary phase-shift keying (PSK) modulation format.

11. A method for encoding data, comprising the steps of: receiving user data; encoding said user data in accordance with a predetermined coding format to provide a first number of encoded symbol streams;

converting said first number of encoded symbol streams into a different second number of reordered encoded symbol streams, the step of converting further including the step of delaying ones of said second number of reordered encoded symbol streams by different delays; and transmitting symbol sets provided by said second number of reordered encoded symbol streams in accordance with a predetermined encoding format.

12. The method of claim 11 wherein said step of encoding is a convolutional encoding.

13. The method of claim 11 wherein said step of encoding format is a rate ½ encoding punctured for rate k/n where k and n are integers and k/n is a fraction greater than ½.

14. The method of claim 11 further comprising the step of generating each of said symbol sets using at least one encoded symbol from each of said second number of reordered encoded symbol streams.

15. The method of claim 11 wherein said step of transmitting is performed in accordance with a modified Gray code.

16. The method of claim 11 wherein said step of transmitting is performed in accordance with an 8-ary phase-shift keying (PSK) modulation format.

17. A system for encoding data, comprising:

an encoder having an input for receiving user data and encoding said user data in accordance with a first predetermined coding format and having an output for providing encoded symbols;

a symbol buffer having an input coupled to said encoder output for reordering said encoded symbols in accordance with a predetermined grouping format and having an output, said symbol buffer comprising a plurality of delay elements wherein each of said plurality of delay elements delays ones of said encoded symbols by different delays; and a transmitter having an input coupled to said symbol buffer output for modulating and transmitting sets of said reordered encoded symbols, said sets of said reordered encoded symbols each being mapped to a modulation value in accordance with a second predetermined coding format.

18. The system of claim 17 wherein said encoder is a convolutional encoder.

19. The system of claim 18 wherein said encoder is a rate ½ encoder punctured for rate k/n where k and n are integers and k/n is a fraction greater than ½.

20. The system of claim 17 further comprising a rate converter disposed having an input coupled to said encoder output having an output coupled to said symbol buffer input.

21. The system of claim 17 wherein said predetermined encoding format is a modified Gray code.

22. The apparatus of claim 17 wherein said predetermined encoding format is an 8-ary phase-shift keying (PSK) modulation format.

23. An apparatus for decoding data, comprising:

demodulator means for receiving a transmitted signal and for demodulating said transmitted signal in accordance with a predetermined demodulation format to provide a first number of streams of symbol estimates;

symbol grouping means for converting said first number of streams of symbol estimates into a different second number of streams of reordered symbol estimates, said symbol means comprising a plurality of delay means wherein each of said plurality of delay means delays ones of said first number of streams of symbol estimates by different delays; and decoder means for decoding symbol sets provided by said second number of streams of reordered symbol estimates.

24. The apparatus of claim 23 wherein said decoder means is a Viterbi decoder.

25. (Amended). The apparatus of claim 23 wherein said symbol grouping means includes means for providing said symbol sets so as to include at least one of said symbol estimates from each of said second number of streams of reordered symbol estimates.

26. The apparatus of claim 23 further comprising a metric computer means disposed between said symbol grouping means and said decoder means for receiving said symbol estimates and generating sets of decoder metrics in accordance with a predetermined metric computation format.

27. A method for decoding data, comprising the steps of:

receiving a transmitted signal;

demodulating said transmitted signal in accordance with a predetermined demodulation format to provide a first number of streams of symbol estimates;

converting said first number of streams of symbol estimates into a different second number of streams of reordered symbol estimates, said step of converting including the step of delaying ones of said first number of streams of symbol estimates by different delays; and decoding symbol sets provided by said second number of streams of reordered symbols estimates.

28. The method of claim 27 wherein said decoder format is a Viterbi decoding format.

29. The method of claim 27 further comprising the step of providing each of said symbol sets so that at least one of said symbol estimates from each of said second number of streams of reordered symbol estimates is included within each of said symbol sets.

30. The method of claim 27 further comprising the step of generating sets of decoder metrics for said symbol estimates in accordance with a predetermined metric computation format.

31. A system for decoding data, comprising:

a demodulator having an input for receiving a transmitted signal and for demodulating said transmitted signal in accordance with a predetermined demodulation format and having an output to provide sets of symbol estimates, each of said sets of symbol estimates being associated with a modulation value based upon said predetermined demodulation format;

a symbol buffer having an input coupled to said demodulator output, for reordering said sets of symbol estimates in accordance with a predetermined grouping format and having an output for providing sets of reordered symbol estimates, said symbol buffer comprising a plurality of delay elements wherein each of said plurality of delay elements delays ones of said symbol estimates within each of said sets of symbol estimates by different delay durations; and a decoder having an input coupled to said symbol buffer output for decoding said sets of reordered symbol estimates in accordance with a predetermined decoding format.

32. The system of claim 31 wherein said decoder is a Viterbi decoder.

33. The system of claim 31 further comprising a rate converter disposed between said symbol buffer and said decoder having an input coupled to said symbol buffer and having an output coupled to said decoder input.

34. The system of claim 31 further comprising a metric computer having an input coupled to said symbol buffer and having an output coupled to said decoder input.

35. A system for encoding digital data for trellis modulation comprising:

first means for receiving k input data bits;

second means for encoding said k input data bits according to a first encoding format to provide n symbols;

third means for converting said n symbols to provide said n symbols as a sequence of sets of at least three symbols;

fourth means for delaying for a predetermined first duration a second symbol of each set of three symbols;

fifth means for delaying for a predetermined second duration a third symbol of each set of three symbols; and sixth means for providing an interleaved symbol set including a first symbol of one of said sets of symbols with corresponding delayed second and third symbols of previous symbol sets.

36. A system for decoding interleaved trellis modulated data comprising:

first means for receiving and decoding said interleaved trellis modulated data to provide sets of three symbols;

second means for delaying for a predetermined first duration a first symbol of each set of three symbols;

third means for delaying for a predetermined second duration a second symbol of each set of three symbols;

fourth means for combining delayed first and second symbols with third symbols of said sets of three symbols to provide a set of n symbols; and fifth means for decoding according to a decoding format said set of n symbols.

* * * * *